United States Patent
Zieren et al.

(10) Patent No.: US 8,680,850 B2
(45) Date of Patent: Mar. 25, 2014

(54) MAGNETIC FIELD ANGULAR SENSOR AND SENSING METHOD

(71) Applicant: NXP B.V., Eindhoven (NL)

(72) Inventors: Victor Zieren, Valkenswaard (NL); Robert Hendrikus Margaretha van Veldhoven, Dommelen (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/044,264

(22) Filed: Oct. 2, 2013

(65) Prior Publication Data

US 2014/0028299 A1    Jan. 30, 2014

Related U.S. Application Data

(62) Division of application No. 13/020,721, filed on Feb. 3, 2011.

(30) Foreign Application Priority Data

Feb. 4, 2010   (EP) ..................................... 10152598

(51) Int. Cl.
*G01B 7/30*     (2006.01)
*G01R 33/02*    (2006.01)
*G01R 33/09*    (2006.01)

(52) U.S. Cl.
USPC ................. 324/207.25; 324/207.21; 324/252

(58) Field of Classification Search
USPC ....................................................... 324/207.25
See application file for complete search history.

(56) References Cited

U.S. PATENT DOCUMENTS 4,694,248 A    9/1987   Kordi et al.
6,304,074 B1   10/2001   Waffenschmidt

FOREIGN PATENT DOCUMENTS

EP    1 308 696 A2    5/2003

OTHER PUBLICATIONS

Extended European Search Report for European Patent Appln. No. 10152598.8 (Jul. 15, 2010).

*Primary Examiner* — Bot Ledynh

(57) ABSTRACT

A magnetoresistive angular sensing method is disclosed. In a first mode, a first dc external magnetic field in a predetermined direction is applied to an angular sensor arrangement in which the external magnetic field dominates over a magnetic field generated by an input device an angular position of which is to be sensed. In a second mode, a second external magnetic field is applied to the angular sensor. Outputs of the angular sensor arrangement in the two modes are processed to determine an angular orientation of the input device with offset voltage compensation.

6 Claims, 15 Drawing Sheets

MAGNETIC FIELD ANGULAR SENSOR AND SENSING METHOD

CROSS-REFERENCE TO RELATED APPLICATION

This application is a division of copending application Ser. No. 13/020,721, filed on Feb. 2, 2011, which claims priority under 35 U.S.C. §119 of European patent application no. 10152598.8, filed on Feb. 4, 2010, the contents of which are incorporated by reference herein.

The invention relates to magnetic field sensors and sensing methods. In particular, the invention relates to magnetoresistive angular sensors.

Magnetic sensors are increasingly important in various industries. In the automotive industry in particular, various sensors such as parking sensors, angular sensors, ABS (Automatic Braking System) sensors and tyre pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors.

Several different magnetic sensor technologies are currently available, such as sensors based on the Hall effect or the magnetoresistive effect. Anisotropic magnetoresistive (AMR) and giant magnetoresistive (GMR) sensors are particular examples of sensor types based on the magnetoresistive effect. Hall effect sensors can be integrated monolithically into integrated circuits, which makes them cheap, but they are also known for their low sensitivity and consequent inaccuracy. AMR sensors, while having a much higher sensitivity compared to Hall effect sensors, require more fabrication steps because they cannot be integrated monolithically, making a total sensor system more expensive. AMR sensors can be deposited, usually by sputtering of $Ni_{80}Fe_{20}$ on a separate die or on top of a monolithic structure. An annealing process, sometimes in a magnetic field, is often used for increased stabilisation of the magnetic state in the magnetoresistive material.

GMR sensors typically have a higher sensitivity than AMR sensors. However, a GMR sensor consists of various thin layers and critical interfaces. The technology required to fabricate such sensors is considerably more complicated and expensive. Furthermore, due to the thin multiple layers making up a GMR sensor, the operating temperature range is also limited. Therefore often AMR sensors are chosen as a good compromise in magnetic sensor applications. This invention is applicable to magnetoresistive sensors in general.

By way of example, an AMR sensor 101 is sketched in FIG. 1 left. The AMR sensor is supplied by a sense current $I_{sense}$ that can be extracted from for example a reference voltage $V_{ref}$ in series with a resistor R. A typical AMR transfer function 102, defined as the AMR sensor resistance, $R_{MR}$, as a function of the applied (or external) magnetic field, $H_{ext}$, is displayed in FIG. 1 right.

In an angular sensor, the external magnetic field rotates, caused by rotation of the device which is having its angular position measured. When the external magnetic field is aligned with the current path, the component perpendicular to the current direction is zero, and this is at the peak in the graph.

The transfer function is symmetrical with respect to the y-axis and consequently has vanishing sensitivity near the zero crossings of $H_{ext}$. This strongly hampers an accurate detection of zero-field crossings: for such a symmetrical transfer curve, electronic noise and other disturbing electronic signals have a large impact at and around $H_{ext}=0$.

One known way to tackle this problem is the addition of a coil 201 on top of the AMR sensor, see FIG. 2 left 201. When a DC current ($I_{bias}$) is driven through the coil, an additional field $H_{bias}$ is generated in the AMR sensor. The bias point of the AMR sensor is now shifted from 0 (point 202) to $H_{bias}$ (point 203) on the AMR transfer function, see FIG. 2 right. The AMR is now sensitive at zero $H_{ext}$ and its response to a sinusoidal $H_{ext}$ of the AMR sensor might look like the one depicted in FIG. 2 right.

An alternative known circuit implementation for an angular sensor which addresses this sensitivity issue is a dual bridge sensor, having two full Wheatstone bridges, interwoven to save space. The two bridges are identical but have a 45° angle with respect to each other, so that one has an output which is a sine function of the angle of the external field and the other has an output which is a cosine function of the angle of the external field. The sine and cosine outputs ($V_y$=S sin(2ϕ) and $V_x$=S cos(2ϕ)) are used to calculate the angle:

$$\phi = 1/2\,arctg(V_y/V_x)$$

A problem with magnetic angular sensors is that an offset is present, so that an output is generated even in the absence of a magnetic field, or when a zero output is generated, there is actually a magnetic field present.

For the double bridge implementation, each bridge is sensitive to the double angle 2ϕ, so there is only the possibility to measure the angular interval 0-180°. If $V_y$ and/or $V_x$ contain an offset voltage, the above algorithm will yield an angular error. Therefore the offset needs to be reduced, or preferably be cancelled entirely. This involves setting the sensitivity and the offset of the dual bridge sensor. For this purpose, precalibrated sensors can be used in a system or else offset values can be stored in a memory on board the ASIC.

For almost every application of sensor, the offset remains a problem, which requires the factory to trim the voltage or current or impedance output to a fixed value in the presence of a known value of a stimulus (in this case a magnetic field). Usually, the offset is set for a zero-field condition in a so-called "zero-gauss" chamber in the factory.

During the lifetime of the sensor the offset may change due to aging. Even in shorter time intervals the offset will vary due to changes in environmental conditions. The most common factor influencing this is the temperature. Also mechanical (vibrations, pressure) or chemical conditions may affect the offset.

Offset compensation methods have been proposed which take these changing conditions into account. This requires a thorough knowledge of the actual value of the parameter such as the temperature. However, in case of non-linearities the compensation algorithms will become very complicated. A further factor is that in use of the sensor it will not be possible to set the conditions similar to the factory condition during offset trimming. In the case of an angular sensor, the magnet for which the position is being detected will always be present close to the sensor. So, a zero-field condition is never achieved again.

The invention aims to provide an angular sensor in which compensation for this offset is implemented.

A first known method to compensate for offset is shown in FIG. 3. A test coil is applied on top of the magnetoresistive sensor. This offers the possibility of generating an AC test field $H_T \sin(\omega_T t)$, e.g. for the cosine x-bridge. This provides an ac-bridge output voltage added to the sensor signal due to the rotating magnetic field $H_A$ that is present in the area of the magnetoresistive sensor. This test field provides an output with the same offset that the x-sensor has ($V_{ox}$). If $H_A=0$ (the magnetic field of the device being sensed), the method consists of measuring the averaged value of the test-coil output and using this to adjust the dc-level of the amplifier in the next part of the system. If $H_A>0$ the rotation frequency $\omega_A$ of this input field should be large enough to separate it (filtering) from the test-coil frequency $\omega_T$. In general this is not the case and then the method will become useless. Moreover, if $\omega_A>0$ then the signal at $\omega_A$ itself may be used to determine the offset. The test field then is not necessary.

FIG. 4 is used to explain another known method of offset compensation, for example described in U.S. Pat. No. 4,694,248. This method is called sensitivity modulation. The sensor has a controlling parameter to adjust the sensitivity between S and S'. This yields a circular ($V_x$,$V_y$) output as shown where $V_x$ and $V_y$ are the two bridge circuit outputs. At some time instant, the output is at point A. The value of $V_{xA}$ and $V_{yA}$ are shown for sensitivity S as well as when switching to a lower sensitivity of S' (which sets the output into a point A'). Then, $V_{xA}'$ and $V_{yA}'$ values apply. If offsets $V_{x0}$ and $V_{y0}$ are present for the x- and the y-channel, respectively, the offset can be cancelled as follows:

$$V_{xA}=V_{x0}+S_x H_A \cos(\phi)$$

$$V_{xA'}=V_{x0}+S'_x H_A \cos(\phi)$$

$$V_{yA}=V_{y0}+S_y H_A \sin(\phi)$$

$$V_{yA'}=V_{y0}+S'_y H_A \sin(\phi)$$

Now, the voltage differences can be calculated:

$$V_{xA}-V_{xA'}=(S_x-S'_x).H_A \cos(\phi)$$

$$V_{yA}-V_{yA'}=(S_y-S'_y).H_A \sin(\phi)$$

which is completely independent of any offset. Defining:

$$Q \equiv (V_{xA}-V_{xA'})/(V_{yA}-V_{yA'}),$$

And if $S_x \equiv S_y \equiv S$ and $S'_x = S'_y$, $\equiv S'$ then $S-S'=S_x-S'_x=S_y-S'_y$. If $S \neq S'$ we find:

$$\phi = arctg(-1/Q)$$

This method may work well, but only if:
a) The offset is not affected by switching between S and S'.
b) Such a controlling parameter for varying the sensitivity needs to be provided.

For some classes of silicon-based Hall sensors this is true, but for magnetoresistive sensors this sensitivity control is less easily implemented.

Thus, there remains a need for a method for cancelling offset in a magnetoresistive angular sensor.

According to the invention, there is provided a magnetoresistive angular sensor, comprising:
an angular sensor arrangement;
an input device, the angular orientation of which is to be sensed and which comprises a magnetic field generator;
an external magnetic field generator;
control means for controlling the external magnetic field generator; and
processing means for processing the angular sensor arrangement output,
wherein the control means is adapted to control the external magnetic field generator to provide a first mode in which a dc external magnetic field is provided in a predetermined direction and which dominates over the magnetic field generated by the input device, and a second mode in which the external magnetic field is smaller, and wherein the processing means is adapted to combine the angular sensor arrangement outputs from the two modes and determine the input device angular orientation with offset voltage compensation.

This method uses an external field to generate two sets of angular sensor outputs. By knowing the orientation of the test field, and making it dominate over the field being sensed, it is possible to compensate for the offset voltages when combining the sensor measurements.

The angular sensor arrangement can comprise first and second angular sensor circuits formed from magnetoresistive elements. Using two sensor circuits enables sensitivity to be provided at an increased range of angles, to compensate for the symmetrical response curve of an individual magnetoresistive element. For example, the first angular sensor circuit can comprise a first bridge circuit formed from magnetoresistive elements, and the second angular sensor circuit can comprise a second bridge circuit from magnetoresistive elements and oriented at 45 degrees with respect to the first bridge circuit. Each bridge circuit can comprise four magnetoresistive elements arranged in a rectangle/square and electrically connected as a Wheatstone bridge.

The external magnetic field in the second mode is preferably at least 10 times smaller than in the first mode, and in practice, the external field should be as large as possible within the design constraints. In the second mode, the angular sensor is for sensing the magnetic field of the input device, so this needs to have a measurable influence on the overall magnetic field present. The external magnetic field in the second mode can for example be zero.

The external field in the first mode is preferably at least 10 times larger than the magnetic field generated by the input device This is so that the angular sensor measurements are dominated by the external field, so that the measurements are effectively in respect of a known magnetic field direction.

The external magnetic field generator can comprise a coil or a plurality of coils in proximity to the magnetoresistive elements.

The invention also provides a magnetoresistive angular sensing method, comprising:
in a first mode, applying a first dc external magnetic field in a predetermined direction to an angular sensor arrangement, in which the external magnetic field dominates over a magnetic field generated by an input device the angular position of which is to be sensed;
in a second mode, applying a second, smaller external magnetic field to the angular sensor;
processing the angular sensor arrangement outputs in the two modes to determine the input device angular orientation with offset voltage compensation.

In the first mode, if the magnetic field generated by the input device can be made to be zero, the accuracy of the method is improved.

Examples of the invention will now be described in detail with reference to the accompanying drawings, in which.

Figure 12:
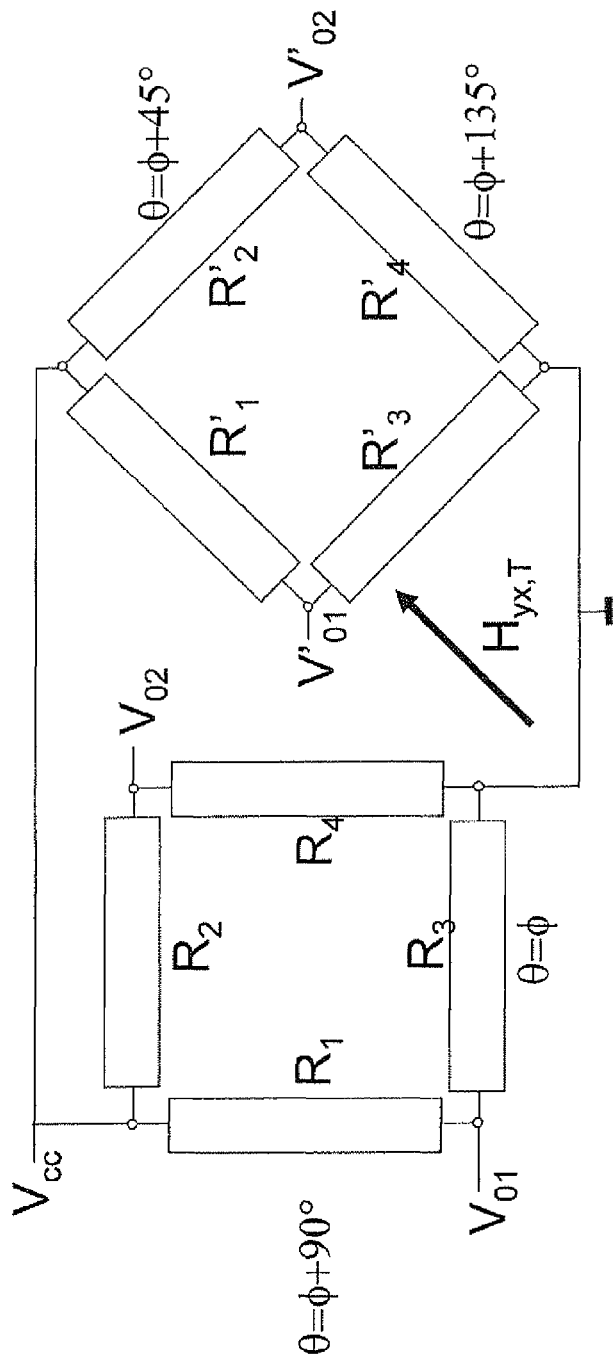
FIGS. 12 and 13 show a fourth set of calculations for the offset compensation method of the invention with an external field in a fourth direction.
Figure 13:
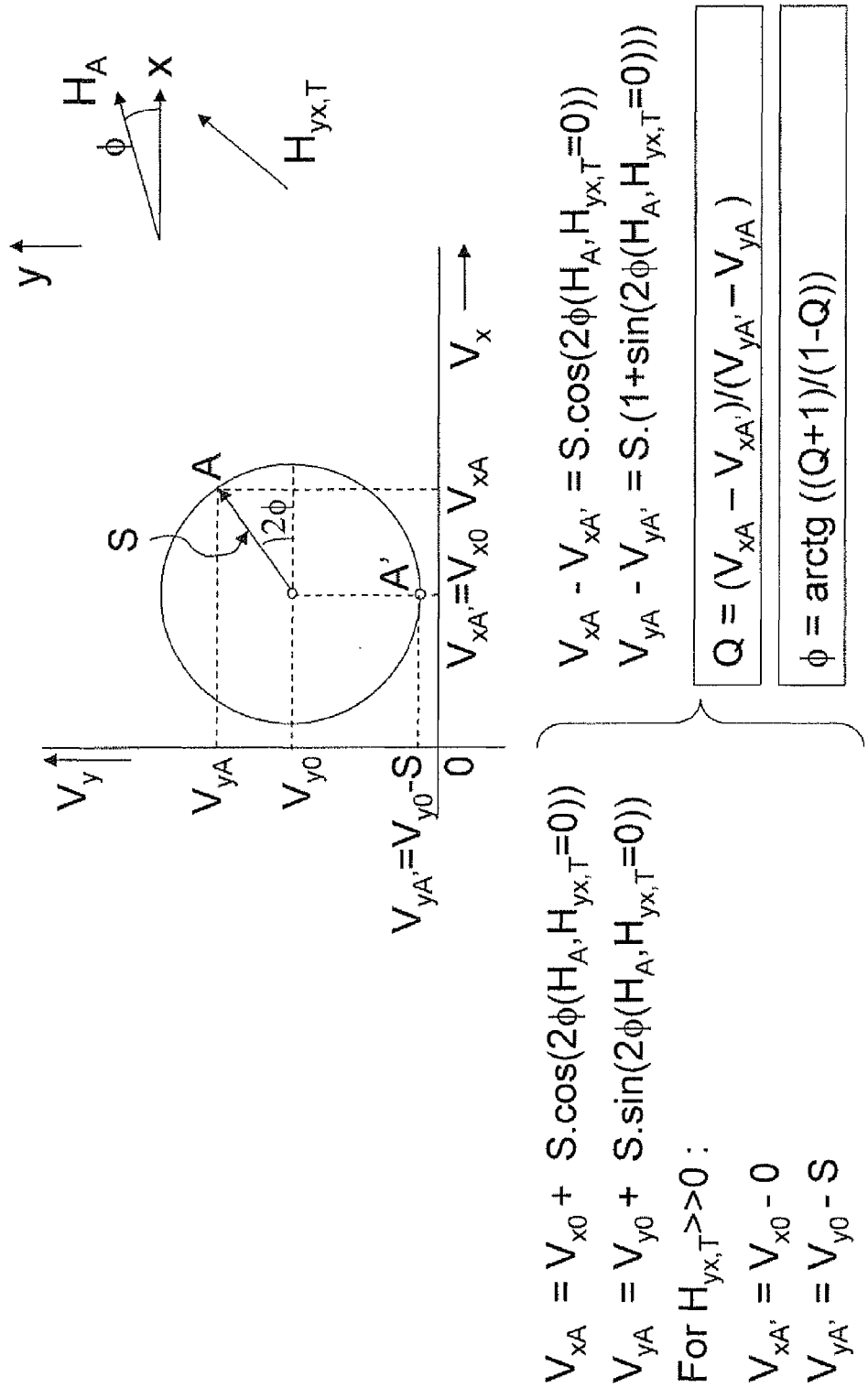
Figure 14:
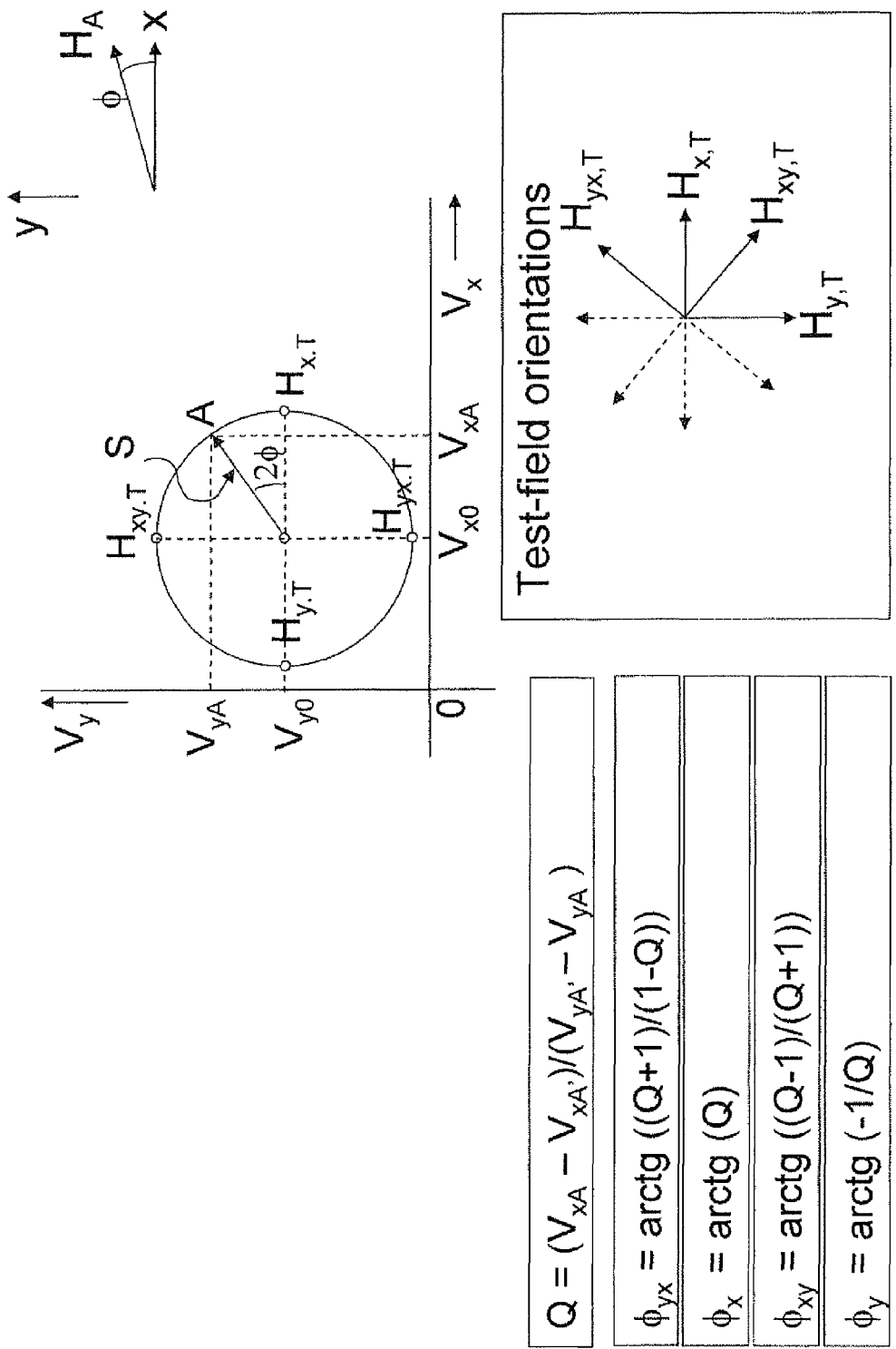
Figure 15:
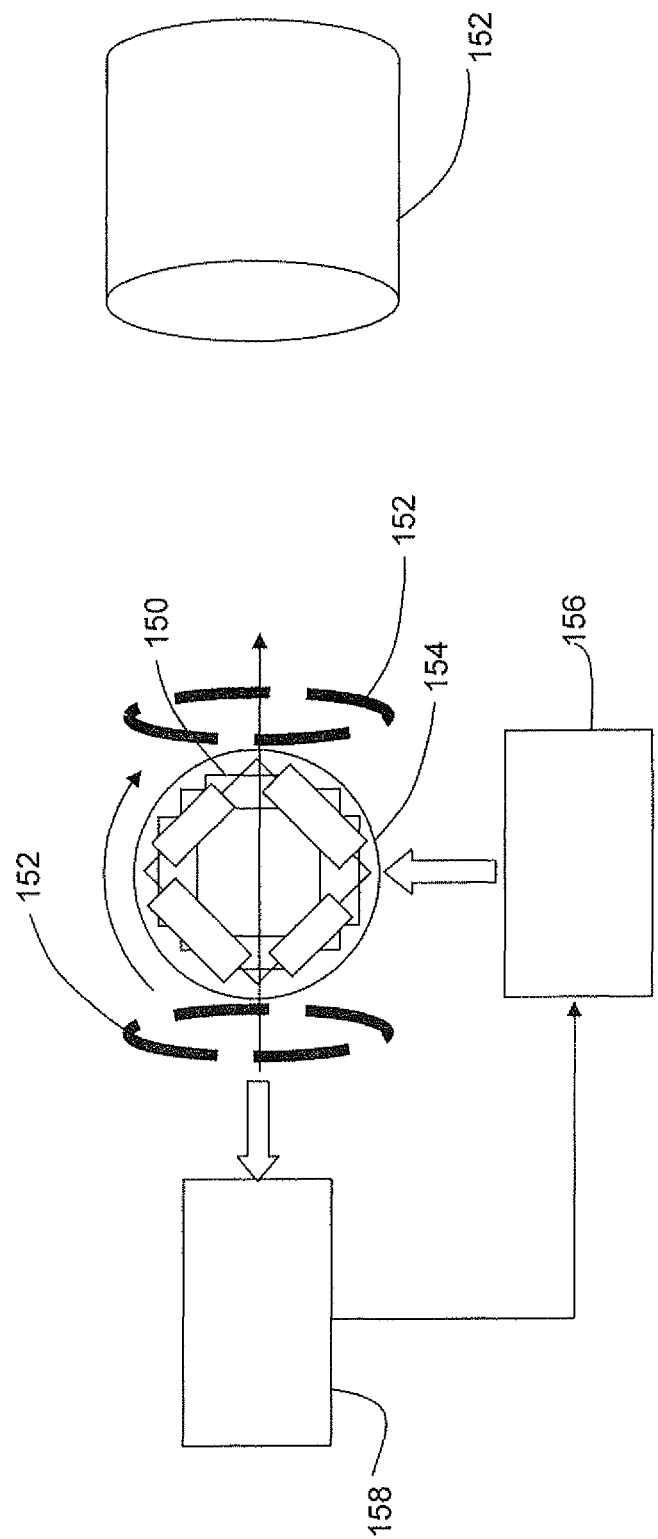

FIG. 14 provides a summary of the results demonstrated in FIGS. 6 to 13; and FIG. 15 shows schematically the magnetoresistive angular sensor of the invention.

The invention provides a magnetoresistive angular sensor, in which an external magnetic field generator is used to provide a first mode in which a dc external magnetic field is provided in a predetermined direction and which dominates over the magnetic field generated by the input device being sensed. In a second mode, the external magnetic field is smaller. The angular sensor arrangement outputs from the two modes are combined, and this enables the input device angular orientation to be determined with offset voltage compensation.

Figure 1:
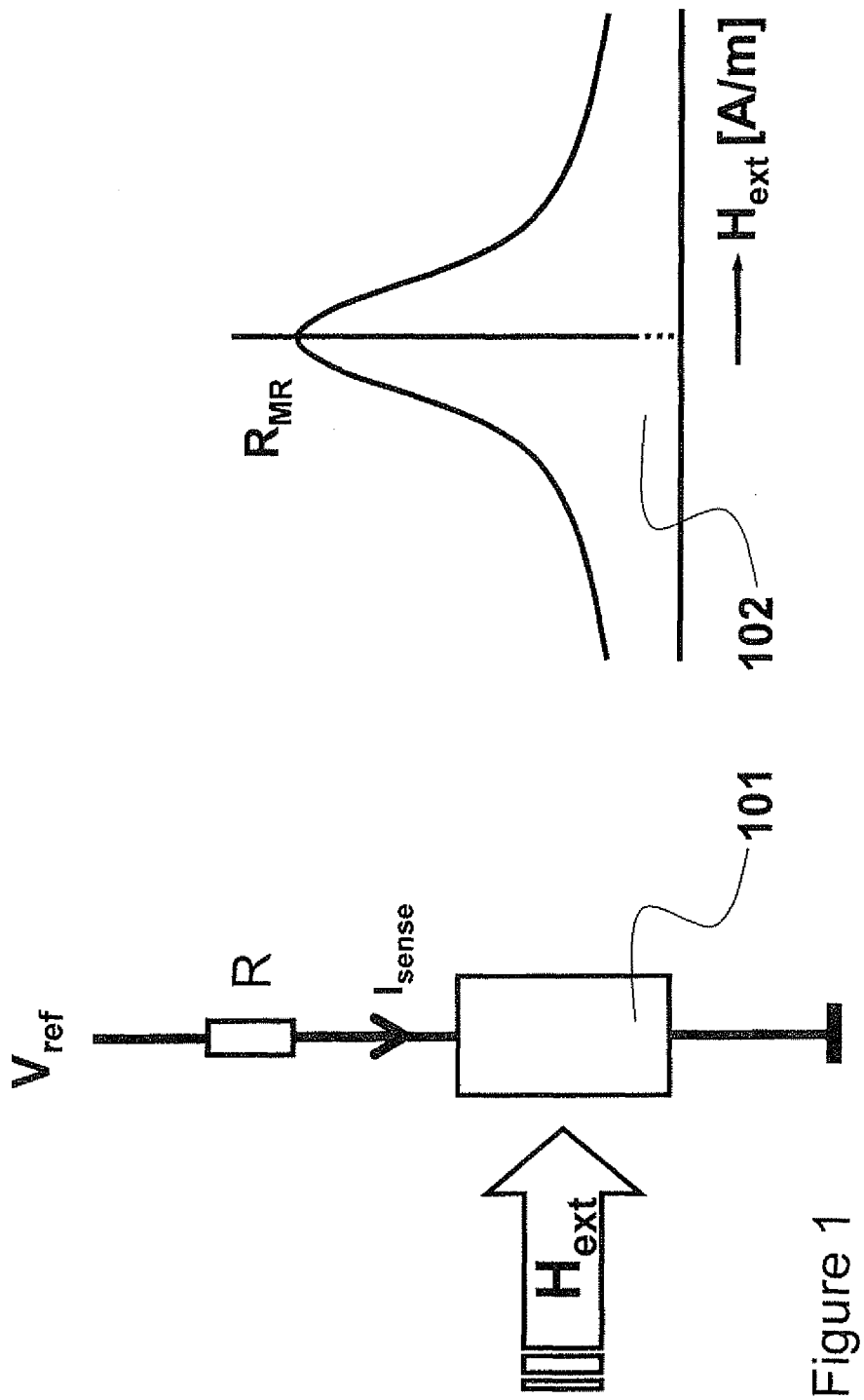
FIG. 1 shows a known magnetoresistive sensor and the typical magnetoresistive transfer function.
Figure 2:
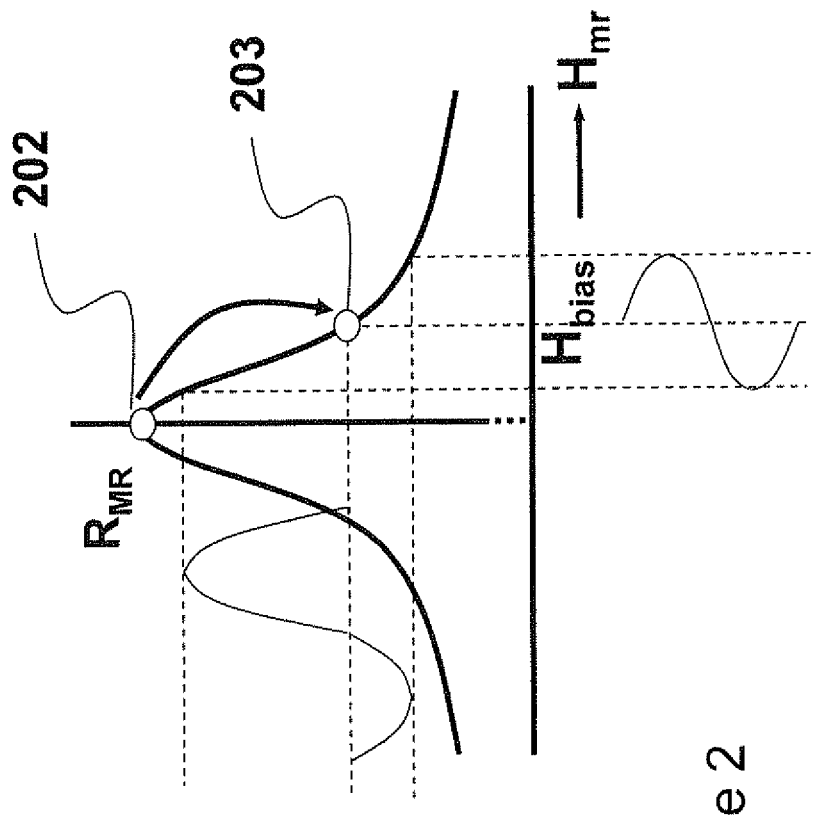
FIG. 2 shows the sensor of FIG. 1 with the addition of a coil on top and the modified magnetoresistive transfer function.
Figure 2:
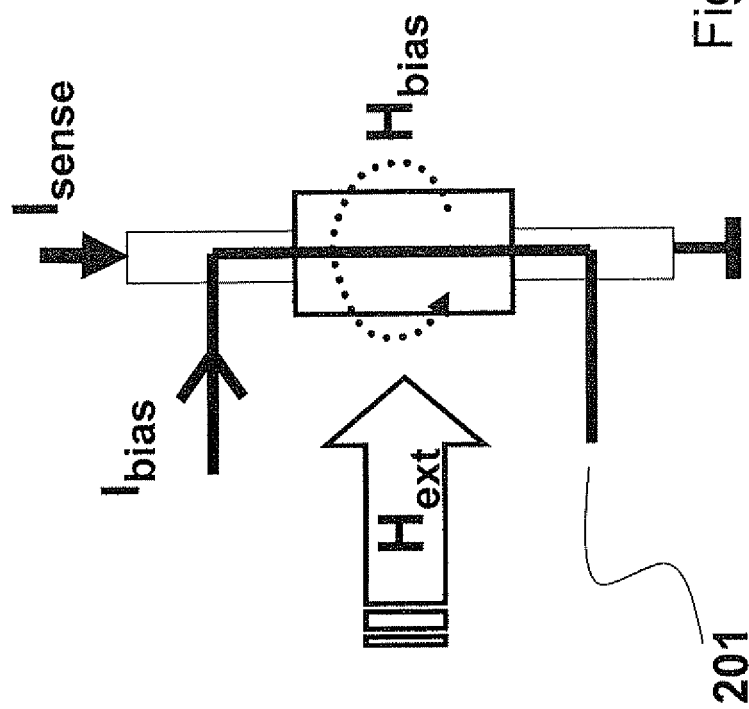
Figure 3:
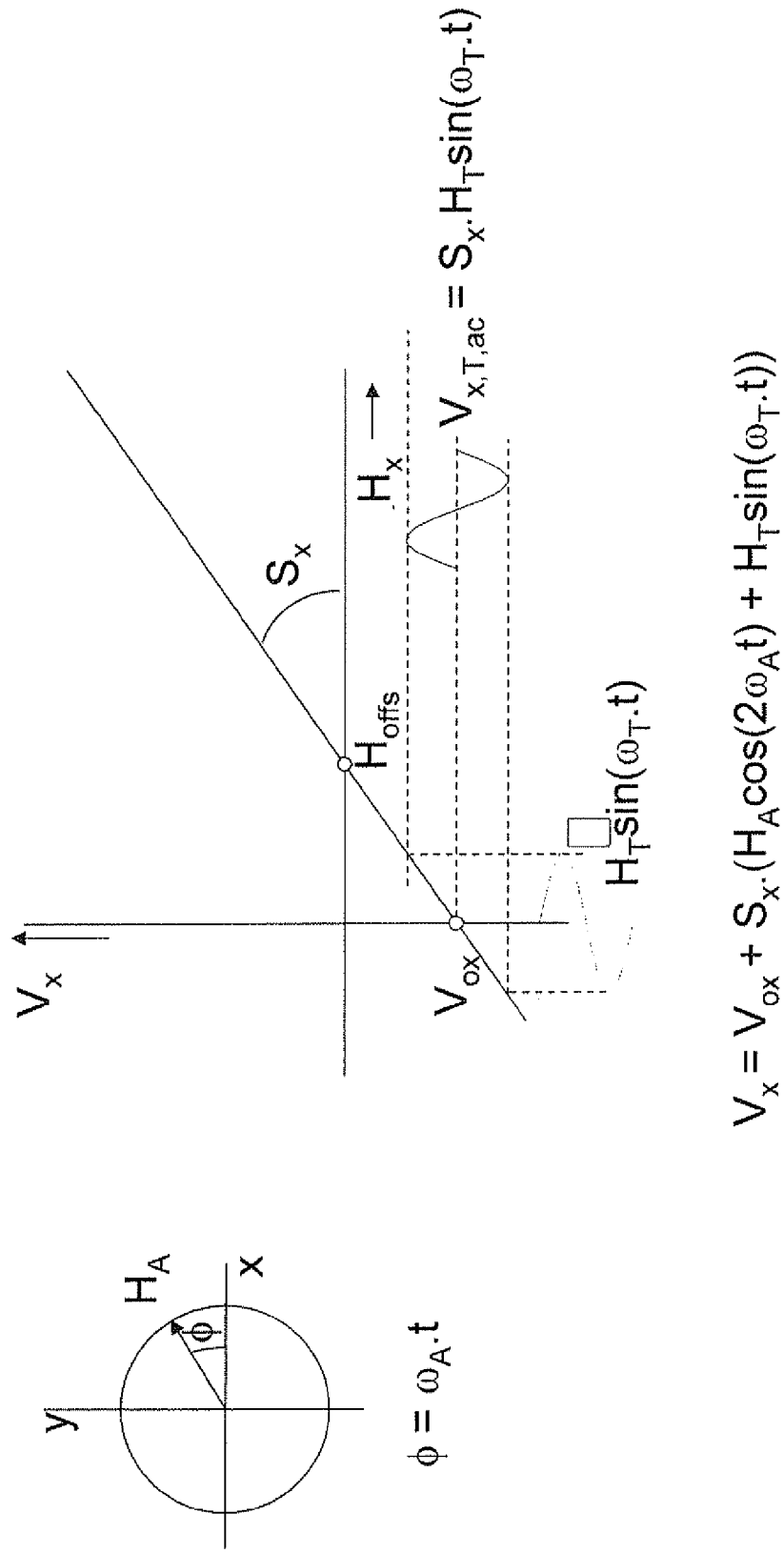
FIG. 3 is used to explain a first way to compensate for offset voltages.
Figure 4:
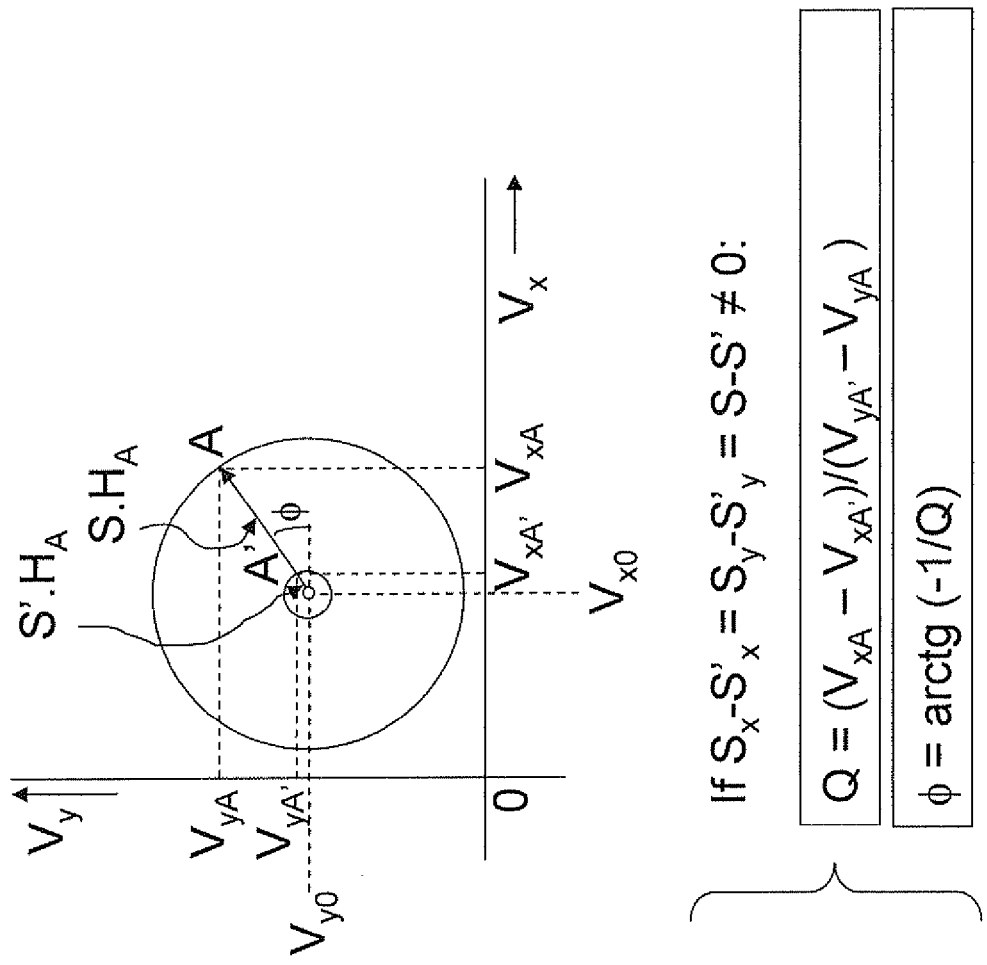
FIG. 4 is used to explain a second way to compensate for offset voltages.
Figure 5:
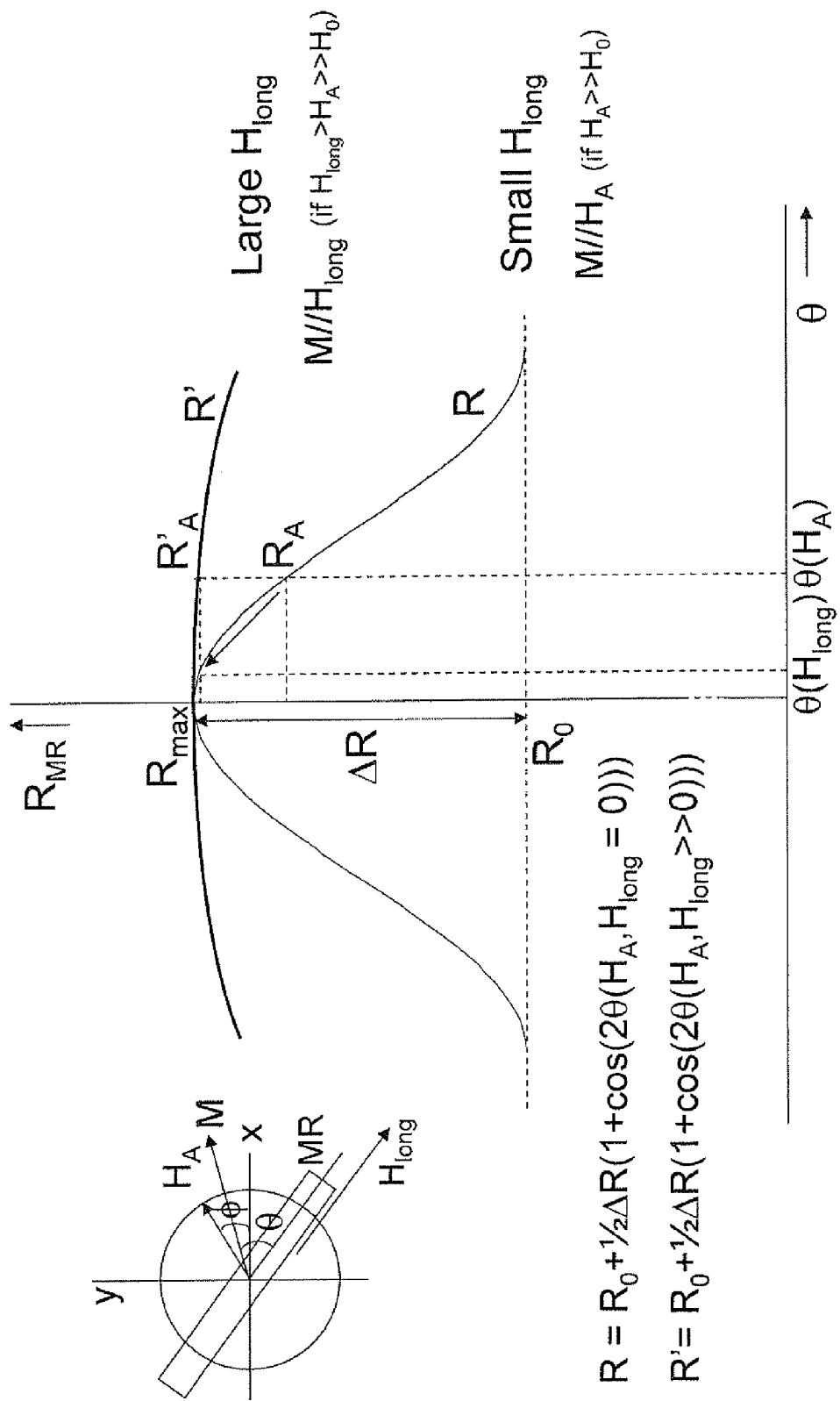
FIG. 5 is used to explain the concept underlying the offset compensation approach of the invention.

FIG. 5 shows the well-known relation of the resistance $R_{MR}$ of an elongated magnetoresistive stripe and the angle $\theta$ for two cases.

The image of the magnetoresistive stripe shows the direction of the external magnetic field $H_A$ to be sensed, and the resulting direction of magnetisation M of the magnetoresistive stripe. An external field $H_A$ in a direction perpendicular to the magnetoresistive stripe length is shown. The angle $\theta$ is the angle between the resulting magnetisation direction M and the current vector I. If an additional magnetic field is present in the current axis I direction, the magnitude of this additional field will influence the magnetisation direction. A very large additional field $H_{long}$ will cause the vector M to align in the I vector direction, whereas a small or no additional field will allow the magnetic field $H_A$ being sensed to influence the direction of the magnetisation vector M.

Curve R is correct only if the longitudinal field $H_{long}=0$. If $H_{long} \gg 0$, the extra force will cause the magnetization to rotate much less easily. As a result the angle $\theta$ will be much smaller. Effectively, the upper, curve R' will be followed for a given value of $H_A$.

Thus, the magnetoresistive sensor has a way of switching its sensitivity, albeit in a very nonlinear way.

The invention is based on the use of an external test field to switch between these different characteristics, which may be considered to be high and low sensitivity modes, and these differences are then used to cancel offset.

The additional switchable field can be implemented in a number of different ways, which will be explained below.

Figure 6:
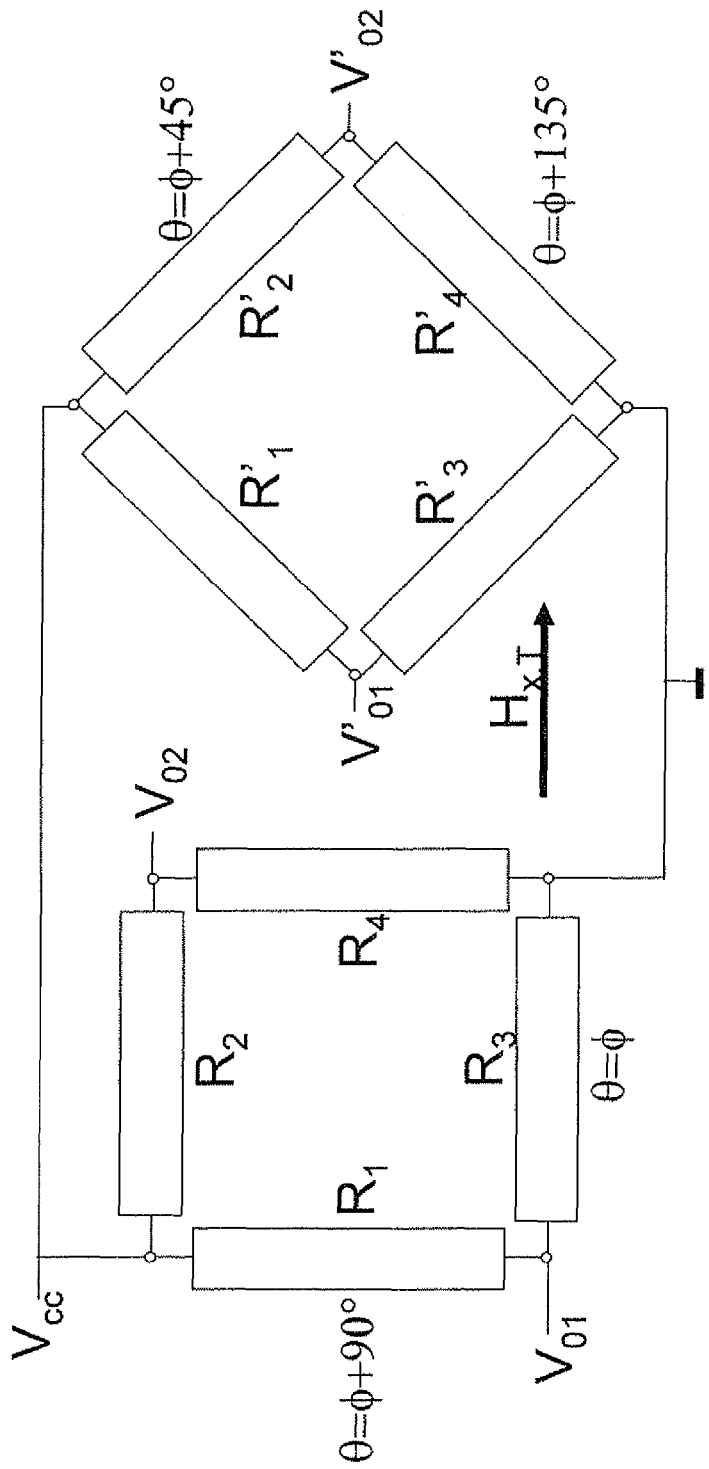
FIGS. 6 and 7 show a first set of calculations for the offset compensation method of the invention with an external field in a first direction.

FIG. 6 shows the two Wheatstone bridges of the angular sensor. In this case, the test field is called $H_{x,T}$ as it is applied in the x-direction. FIG. 6 gives the values of the bridge output voltages for $H_{x,T} \gg 0$.

It is assumed that the field is large enough to cause the magnetization to be parallel to this test field. Therefore $\phi=0$ during the test, so that the test field dominates over the magnetic field to be sensed (which is still present).

The calculation shows that for the case of a test field in the positive x-direction (named $H_{x,T}$), $V_x=S$, and $V_y=0$.

The value S is defined by $V_{cc}$. $\Delta R/(2R_0+\Delta R)=S$. Here, $V_{cc}$ is the bridge supply voltage. $\Delta R$ and $R_0$ are given in FIG. 5 ($\Delta R$ is the difference between maximum and minimum resistance and $R_0$ is the minimum resistance. The same result follows if the test field is in minus x-direction.

Figure 7:
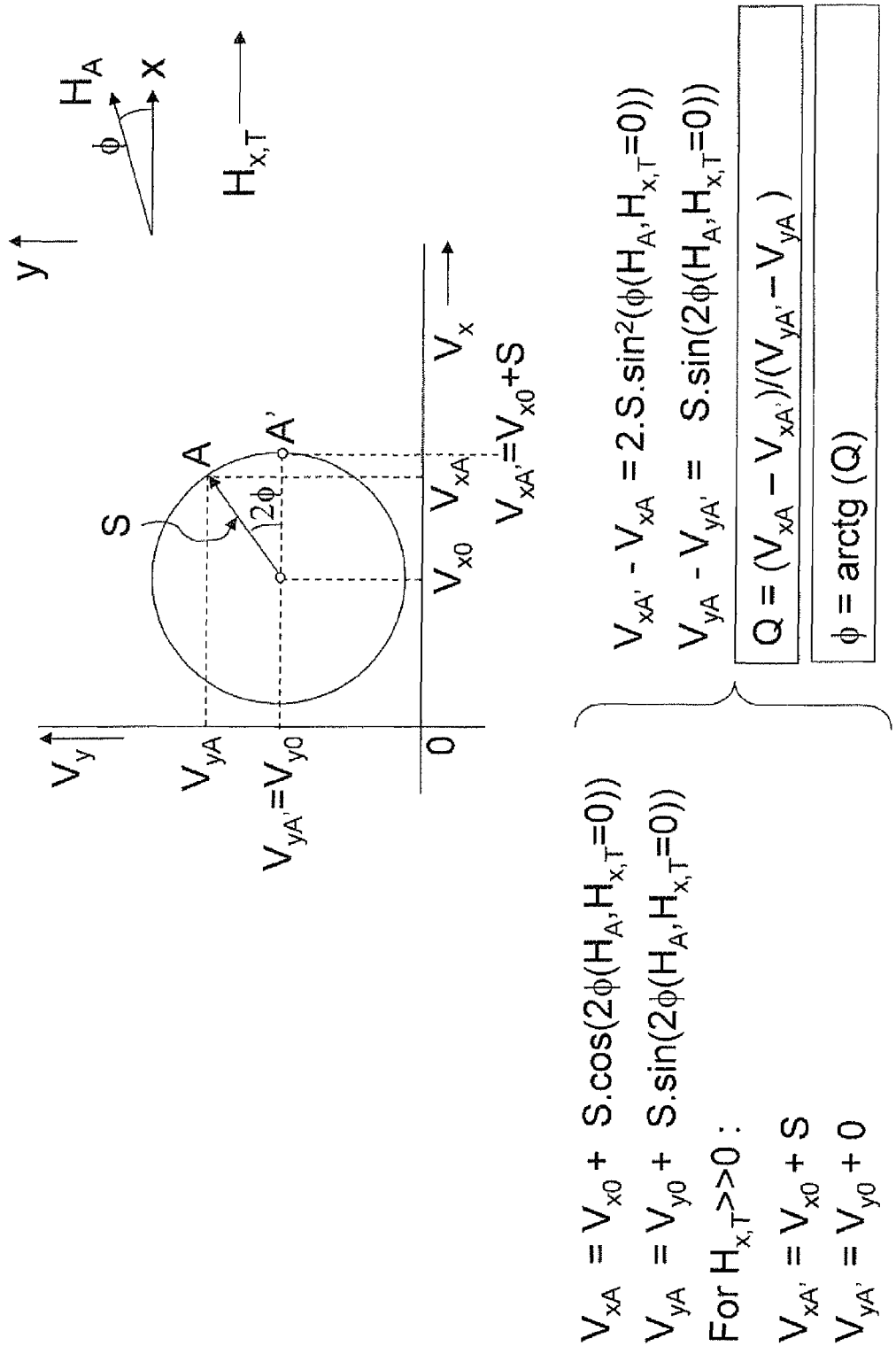

FIG. 7 shows a circle representing the outputs of the angular sensor, $V_x$ and $V_y$. $H_A$ is the rotating field to be sensed and has a momentary angle of $\phi$. The vector points to position A. The centre of the circle is generally not at the origin in the presence of an offset. $V_{x0}$ and $V_{y0}$ are the offset of the x- and y-channels respectively.

The calculation in FIG. 7 gives the values of $V_x$ and $V_y$ in the case of the normal angular sensor measurement (i.e. with no additional external field, so that $H_{x,T}=0$). In this case, the individual magnetoresistive sensor output is defined by:

$$R=R0+\Delta R \cos^2(\theta)$$

The bridge outputs are given by:

$$V_{xA}=V_{x0}+S. \cos(2\phi(H_A,H_{x,T}=0))$$

$$V_{yA}=V_{y0}+S. \sin(2\phi(H_A,H_{x,T}=0)).$$

The values $V_x{}'$, and $V_y{}'$ are also obtained with the external test field applied ($H_{x,T} \gg 0$). It is assumed that the modulation by the test field will not alter the offsets. The test field will move the vector to point at A' (in the x direction from the origin):

$$V_{xA'}=V_{x0}+S$$

$$V_{yA'}=V_{y0}+0$$

Then it can be shown that by taking the differences $$V_{xA}-V_{xA'}=2.S. \sin^2(\phi(H_A,H_{x,T}=0))$$

$$V_{yA}-V_{yA'}=S. \sin(2\phi(H_A,H_{x,T}=0))$$

and after defining $$Q=(V_{xA}-V_{xA'})/(V_{yA'}-V_{yA})$$

It is found that:

$$\phi=arctg(Q).$$

This result shows that the measurand $\phi$ can be retrieved from the sensor output data even in the presence of offset.

Figure 8:
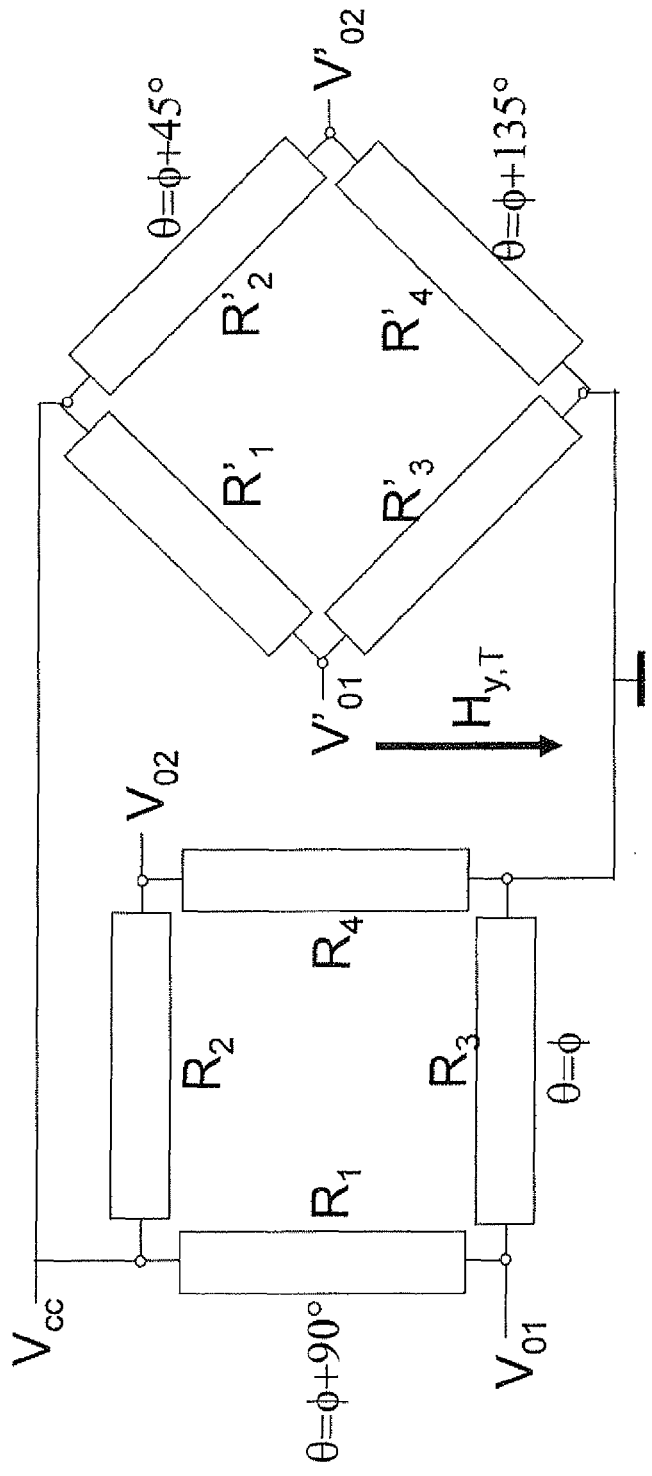
FIGS. 8 and 9 show a second set of calculations for the offset compensation method of the invention with an external field in a second direction.
Figure 9:
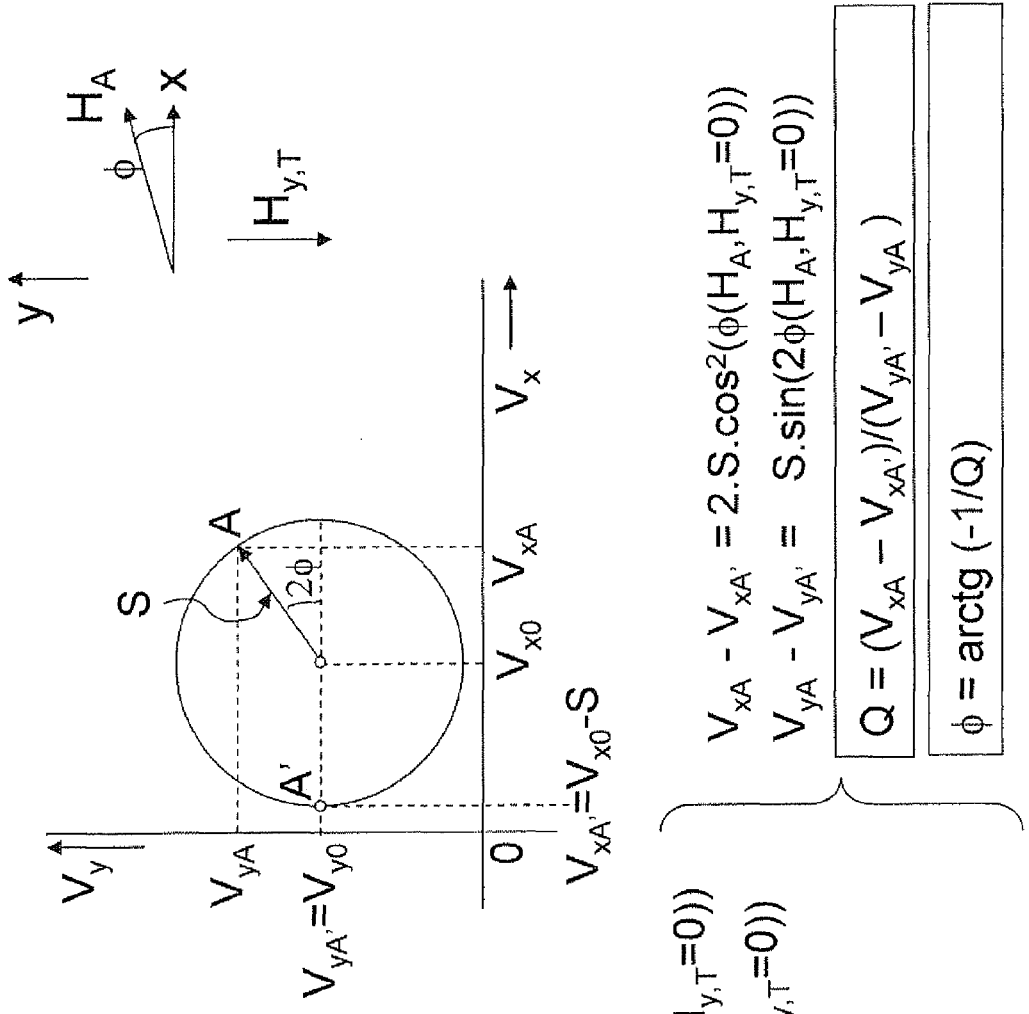

FIGS. 8 and 9 give corresponding calculations for an external field applied in the y direction:

+y-direction and -y-direction($H_{y,T}$) gives $V_x=-S$ and $V_y=0$.

Figure 10:
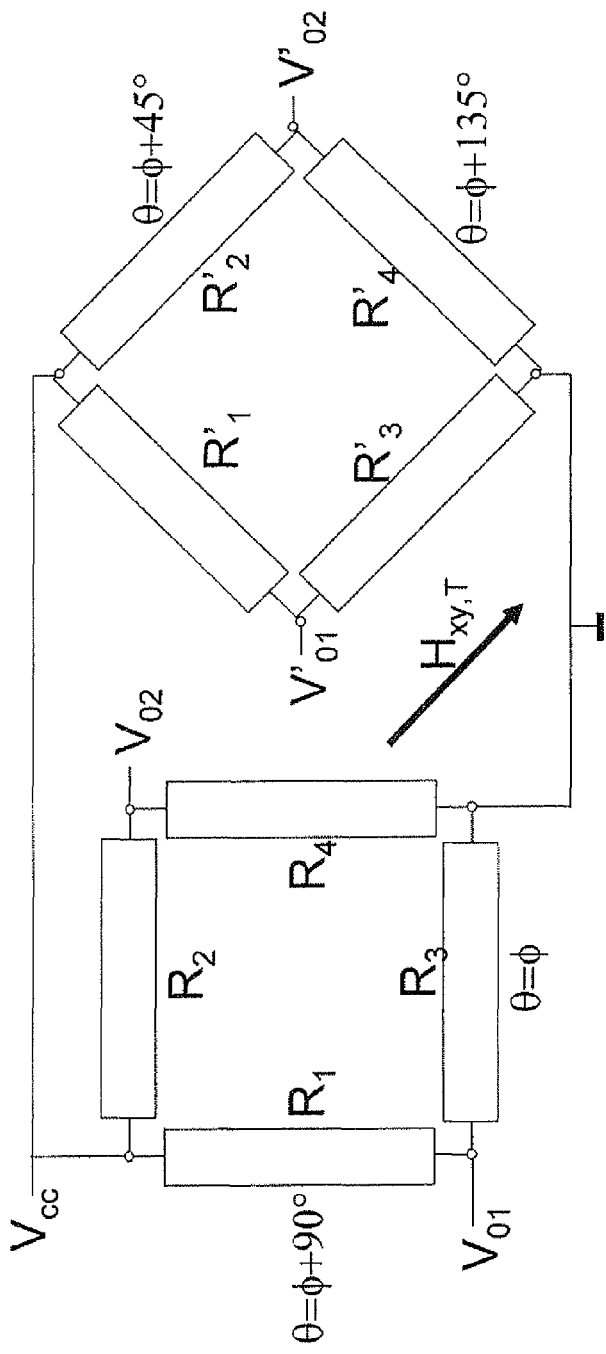
FIGS. 10 and 11 show a third set of calculations for the offset compensation method of the invention with an external field in a third direction.
Figure 11:
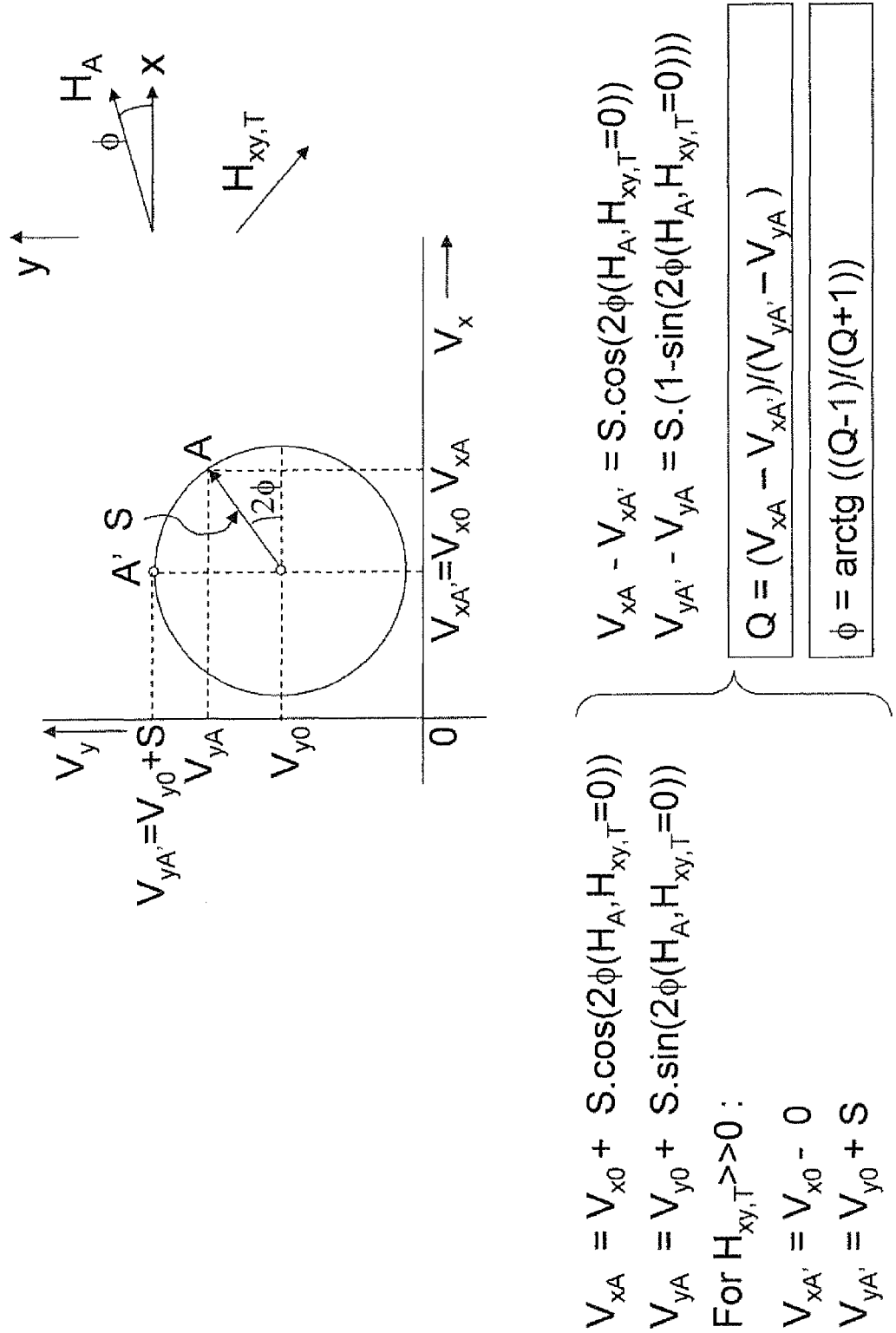

FIGS. 10 and 11 give corresponding calculations for an external field applied in the xy direction:

+xy-direction and -xy-direction($H_{xy,T}$) gives $V_x=0$ and $V_y=S$.

FIGS. 12 and 13 give corresponding calculations for an external field applied in the yx direction:

+yx-direction and -yx-direction($H_{yx,T}$) gives $V_x=0$ and $V_y=-S$.

FIG. 14 gives a summary of the results.

The method involves applying an additional external field (in whichever chosen direction) and which is large enough to dominate over the magnetic field of the device whose angular orientation is being measured. A normal measurement is also carried out (with no additional external magnetic field), and the results are combined to enable cancellation of the offset values.

A summary of the results is below:

If test field is $H_{yx,T}$: then $\phi_{yx}$=arctg $((Q+1)/(1-Q))$
If test field is $H_{x,T}$: then $\phi_x$=arctg $(Q)$
If test field is $H_{xy,T}$: then $\phi_{xy}$=arctg $((Q-1)/(Q+1))$
If test field is $H_{y,T}$: then $\phi_y$=arctg $(-1/Q)$ The test field may be generated by an on-chip coil or by a coil in the magnetoresistive sensor package. Duty cycling will help reduce the dissipation considerably. The measured test data during the short test field pulse can be stored in a memory, preferably on the processor ASIC.

Only one of these test conditions needs to be chosen.

The detailed design of the individual magnetoresistive sensor elements has not been given, as these are completely conventional. A magnetoresistive sensor element is a device which operates based on the property of a material in which a dependence of electrical resistance on the angle between the direction of electrical current and orientation of magnetisation is observed. The effect is attributed to a larger probability of s-d scattering of conduction electrons in the direction of the magnetisation. The net effect is that the electrical resistance has maximum value when the direction of current is parallel to the magnetisation direction.

The relevant alloy $Ni_{80}Fe_{20}$ has an effect of 2%-2.5% and this is sufficient to enable the sensor to operate. However, magnetoresistive effects of up to 50% have been observed in some ferromagnetic uranium compounds.

The test magnetic field needs to dominate the rotating magnetic field. A current of 100 mA dc can be used to create a test magnetic field strength of 5 kA/m over an MR-stripe length of 10 micron. If possible, the magnetic field of the device to be sensed can be turned off or shielded during the application of the test field, so that in this case the rotating magnetic field is zero.

In practice, in the presence of a rotating magnetic field, the test magnetic field will never result in a perfectly static magnetic field in the desired direction (direction M) because the rotating magnetic field will still perturb the dominant test field. Additional processing can be conducted, based on a knowledge of the size of the input magnetic field.

The analysis above has assumed no external magnetic field when measuring the angle of the input. However, a smaller external magnetic field can then be applied. In this case, the mathematical equations to allow the offset voltages to be cancelled will change, but the same number of variables and unknown parameters remain, so that the equations can be solved in analogous manner.

The invention can be applied to different types of angular sensor, and the key feature is the application of a dc test field so that two sets of outputs can be combined. For AMR sensors, an configuration with two bridges is the preferred arrangement, to give a 180 degree angular range, whereas GMR sensors can yield a 360 angular range. The preferred Wheatstone bridge arrangement is used to balance most of the offset that would inherently exist when using a single branch of the bridge. However, the invention is not intended to be limited to the specific sensor configurations described above.

FIG. 15 shows schematically the magnetoresistive angular sensor of the invention. The angular sensor arrangement 150 is for detecting the angular orientation of the input device 154. The sensor arrangement 150 provides its sensor outputs to the processor 158.

The external magnetic field generator is shown as a coil 152 which is energised and controlled by a controller 156. The processor 158 processing the angular sensor arrangement outputs to determine the input device angular orientation with offset voltage compensation. The controller 156 provides the two modes of operation under the ultimate command of the processor 158. Two examples of coil are shown schematically in FIG. 15, one as a two-part arrangement (the left image) and another as a cylindrical coil, but in each case providing a magnetic field along a cylinder axis.

Various modifications will be apparent to those skilled in the art.

The invention claimed is:

1. A magnetoresistive angular sensing method, comprising:
   in a first mode, applying a first dc external magnetic field in a predetermined direction to an angular sensor arrangement, in which the external magnetic field dominates over a magnetic field generated by an input device an angular position of which is to be sensed;
   in a second mode, applying a second, external magnetic field to the angular sensor; and
   processing outputs of the angular sensor arrangement in the two modes to determine an angular orientation of the input device with offset voltage compensation.

2. A method as claimed in claim 1, wherein the angular sensor arrangement comprises first and second angular sensor circuits.

3. A method as claimed in claim 2, wherein the angular sensor arrangement comprises first and second bridge circuits oriented at 45 degrees with respect to each other.

4. A method as claimed in claim 1, wherein the external magnetic field applied in the second mode is at least 10 times smaller than in the first mode.

5. A method as claimed in claim 4, wherein the external magnetic field applied in the second mode is zero.

6. A method as claimed in claim 1, wherein the external field applied in the first mode is at least 10 times larger than the magnetic field generated by the input device.

* * * * *